(12) United States Patent
Turner et al.

(10) Patent No.: US 8,085,178 B2
(45) Date of Patent: Dec. 27, 2011

(54) MULTIPLYING-ADDING RETURN TO ZERO DIGITAL TO ANALOG CONVERTER CIRCUIT AND METHOD

(75) Inventors: Steven E Turner, Nashua, NH (US); Richard B Elder, Jr., Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 29 days.

(21) Appl. No.: 12/477,972

(22) Filed: Jun. 4, 2009

(65) Prior Publication Data

US 2010/0309036 A1    Dec. 9, 2010

(51) Int. Cl.
*H03M 3/00* (2006.01)
(52) U.S. Cl. .................... 341/153; 341/144; 341/145
(58) Field of Classification Search ......... 341/144–154, 341/11–120, 143
See application file for complete search history.

(56) References Cited

U.S. PATENT DOCUMENTS

| | | | | |
|---|---|---|---|---|
| 5,684,482 | A * | 11/1997 | Galton | 341/144 |
| 6,281,825 | B1 * | 8/2001 | Lee | 341/144 |
| 6,414,615 | B1 * | 7/2002 | Cheng | 341/143 |
| 6,812,878 | B1 * | 11/2004 | Jewett et al. | 341/144 |
| 6,977,602 | B1 * | 12/2005 | Ostrem et al. | 341/145 |
| 7,042,379 | B2 * | 5/2006 | Choe | 341/144 |
| 7,187,310 | B2 * | 3/2007 | El-Sankary et al. | 341/120 |
| 7,227,477 | B2 * | 6/2007 | Ye | 341/61 |
| 7,312,737 | B2 * | 12/2007 | Jungerman et al. | 341/141 |
| 7,501,969 | B2 * | 3/2009 | Schoner | 341/144 |
| 7,545,925 | B2 * | 6/2009 | Williams | 379/265.13 |
| 7,956,785 | B2 * | 6/2011 | Baek et al. | 341/144 |
| 8,022,850 | B2 * | 9/2011 | Newman | 341/144 |
| 2006/0227025 | A1 * | 10/2006 | El-Sankary et al. | 341/120 |
| 2009/0195425 | A1 * | 8/2009 | Eloranta et al. | 341/144 |

OTHER PUBLICATIONS

Choe, Myung-Jun et al., "A 1.6-GS/s 12-Bit Return-To-Zero GaAs RF DAC for Multiple Nyquist Operation", IEEE Journal of Solid-State Circuits, Dec. 2005, 13 pages, vol. 40, No. 12.

* cited by examiner

*Primary Examiner* — Linh Nguyen
(74) *Attorney, Agent, or Firm* — Vern Maine & Associates; David A. Rardin (57) ABSTRACT

A digital to analog converter (DAC) method and apparatus employs a multiplying-adding DAC, eliminating digital adder circuitry. Examples are given for multiplying a 3-bit binary number by a 2-bit binary number; however, there are no limitations to the bit-widths of the numbers to be multiplied. The multiplying-adding DAC method can be scaled up or down in bit-width by feeding the DAC with partial sums and adjusting the DAC weights accordingly. An analog to digital converter (ADC) can be placed after the DAC to generate a digital output. By multiplexing preset digital data into the DAC core for return to zero (RTZ), a true zero that is the midpoint of the DAC output range is achieved. It does not return to a rail for single-ended outputs. RTZ in DAC circuits doubles the null frequency of sin(x)/x roll-off inherent in DACs and also helps reduce switching glitches in the DAC output.

20 Claims, 15 Drawing Sheets

Fclock = 2 GHz

MULTIPLYING-ADDING RETURN TO ZERO DIGITAL TO ANALOG CONVERTER CIRCUIT AND METHOD

STATEMENT OF GOVERNMENT INTEREST

The invention was made with United States Government support under Contract No. DAAD17-02-C-0115 awarded by the US Army and under a separate, classified contract. The United States Government has certain rights in this invention.

FIELD OF THE INVENTION

The present invention relates to digital to analog converters (DACs), and more particularly, to a method and apparatus for enhanced performance through improved spurious free dynamic range (SFDR) and accurate return to zero (RTZ) performance.

BACKGROUND OF THE INVENTION

DACs are used in an increasing number of applications, many requiring lower power consumption and higher operating frequencies. Direct Digital Synthesis (DDS) is one of these applications. Basic DDS circuits include an electronic controller, random access memory, a frequency reference, a counter, and a DAC. Some versions of DDS circuits include random access memory (RAM).

Multiplying-Adding

Within direct digital synthesizer circuits, improved spurious free dynamic range (SFDR) is desired. One method to achieve improved SFDR is by adding interpolation to the output of the DDS. To determine the interpolation, an approximation of X sin(theta)+Y cos(theta) can be used. This approximation necessitates the need for an efficient method of multiplication in order to preserve high speed operation of the DDS and minimize power consumption. The traditional method of multiplying two binary numbers involves the use of digital adder circuitry. Digital adder circuitry increases the power consumption of the circuit and reduces operating speed.

The following explanatory discussion involves quotients A and B. A is a 3-bit binary number and B is a 2-bit binary number. The notation for the expanded version of A is A2 A1 A0 and the notation for the expanded version of B is B1 B0. The use of the specific bit-widths is convenient for illustration and implementation, but any bit-widths could be used.

In a traditional binary multiplier approach, each bit of the multiplier is multiplied against the multiplicand and positioned according to the position of the bit within the multiplier, and the resulting products are then summed to form the final result.

Using A and B, this would be:

$$\begin{array}{r} A2 \quad A1 \quad A0 \\ \times \quad B1 \quad B0 \\ \hline S1 = \phantom{xxxx} A2 \cdot B0 \quad A1 \cdot B0 \quad A0 \cdot B0 \\ S2 = A2 \cdot B1 \quad A1 \cdot B1 \quad A0 \cdot B1 \end{array} \Bigg\} \text{Partial Sums}$$

Where the final result of A·B=S1+S2 and the result is a 5-bit binary number that is then fed into a digital to analog converter (DAC) circuit.

Figure 1:
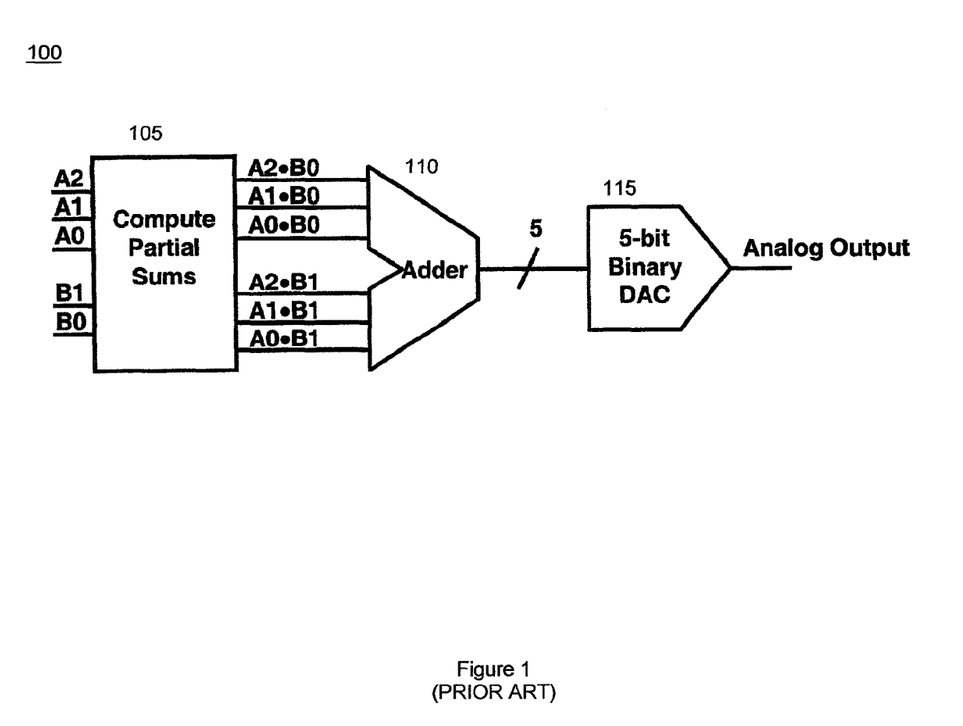
FIG. 1 is a block diagram of prior art multiplication implementation.

FIG. 1 depicts a block diagram 100 of a known multiplication method. As described above, it computes partial sums 105, adds S1 and S2 110 to provide a 5-bit input to 5-bit binary DAC 115. Binary 5-bit DAC 115 has weights of 1, 2, 4, 8, and 16, denoted below by DAC1, DAC2, DAC4, DAC8, and DAC16. The resulting logic equations needed to drive the DAC are:

$DAC1 = A0*B0$ $DAC2 = (A1*B0) \oplus (A0*B1)$ $DAC4 = ((A1 \cdot B0) \cdot (A0 \cdot B1)) \oplus (A2 \cdot B0) \oplus (A1 \cdot B1)$ $DAC8 = ((((A1 \cdot B0) \cdot (A0 \cdot B1)) \cdot ((A2 \cdot B0)+(A1 \cdot B1)))+ ((A2 \cdot B0)+(A1 \cdot B1))) \oplus (A2 \cdot B1)$ $DAC16 = (((((A1 \cdot B0) \cdot (A0 \cdot B1)) \cdot ((A2 \cdot B0)+(A1 \cdot B1)))+ ((A2 \cdot B0)+(A1 \cdot B1)) \cdot (A2B1))$ A large number of gates is involved in the complex logic required to compute this result. This leads to high power consumption and large propagation delay which can decrease speed or necessitate pipelining.

RTZ

The use of return to zero (RTZ) in digital to analog converter (DAC) circuits is a method for doubling the null frequency of sin(x)/x roll-off inherent in DACs. RTZ also helps to reduce switching glitches in the DAC output. Typical approaches return to zero for differential outputs, but return to a rail for single-ended outputs. This introduces a common mode noise signal which can not be totally eliminated in a differential receiver due to practical common mode rejection ratio (CMRR) characteristics. The approach also lends itself to a long worst case slew rate.

In practice, the RTZ is implemented by switching current away from the DAC summing junction.

Figure 6:
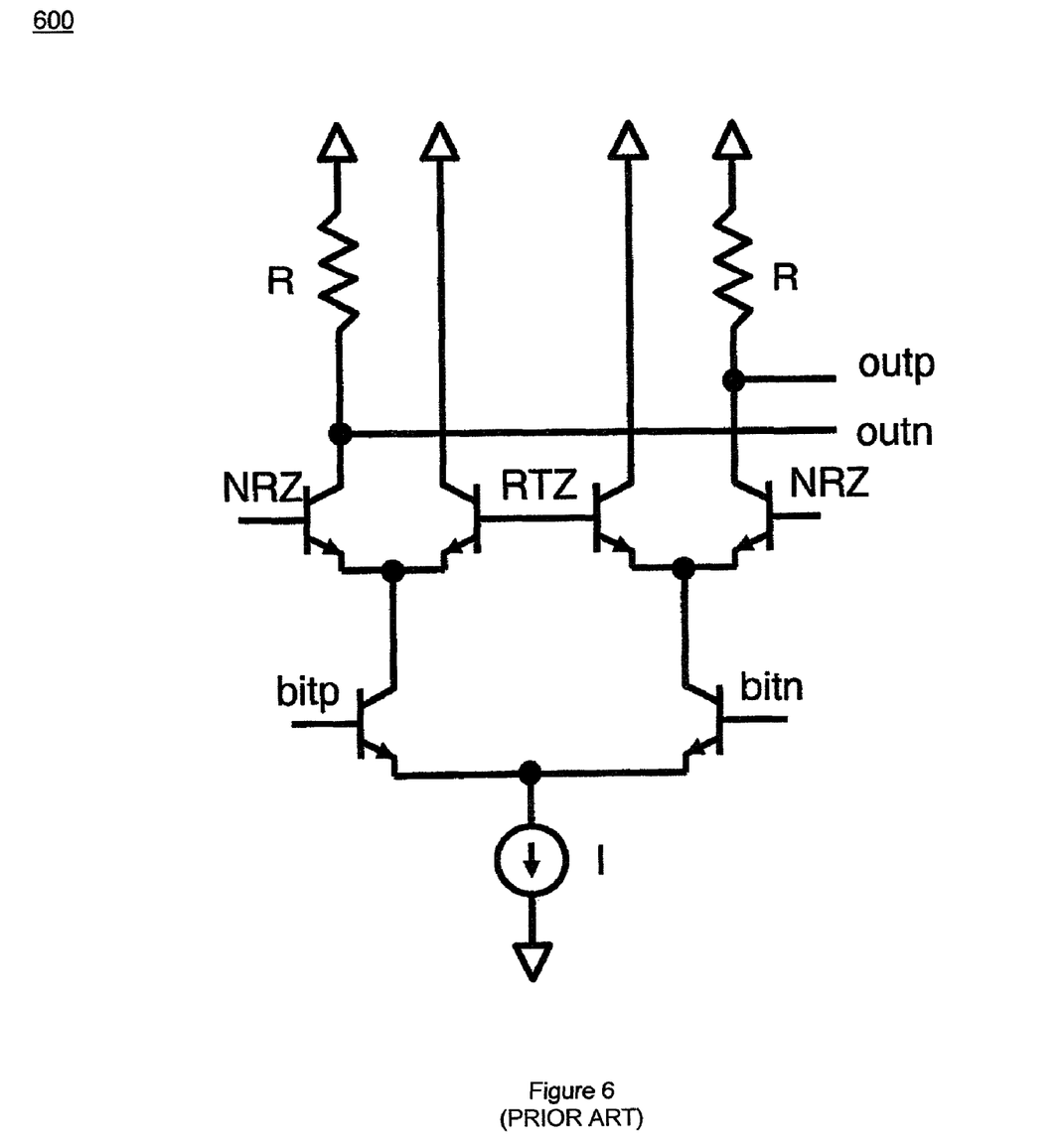
FIG. 6 is a schematic of a prior art DAC current switch.

FIG. 6 is a schematic 600 of the typical known prior art DAC current switch. When NRZ (not return to zero) is high, the current is steered through one of the resistors based on the state of bitp/bitn, so the output voltage at outp/outn is either 0 volts or −I*RV (assuming the top rail is ground, although it could be at any arbitrary voltage). When RTZ is high, the current will not be steered through either resistor, so the both sides of the output are at 0 volts.

Figure 7:
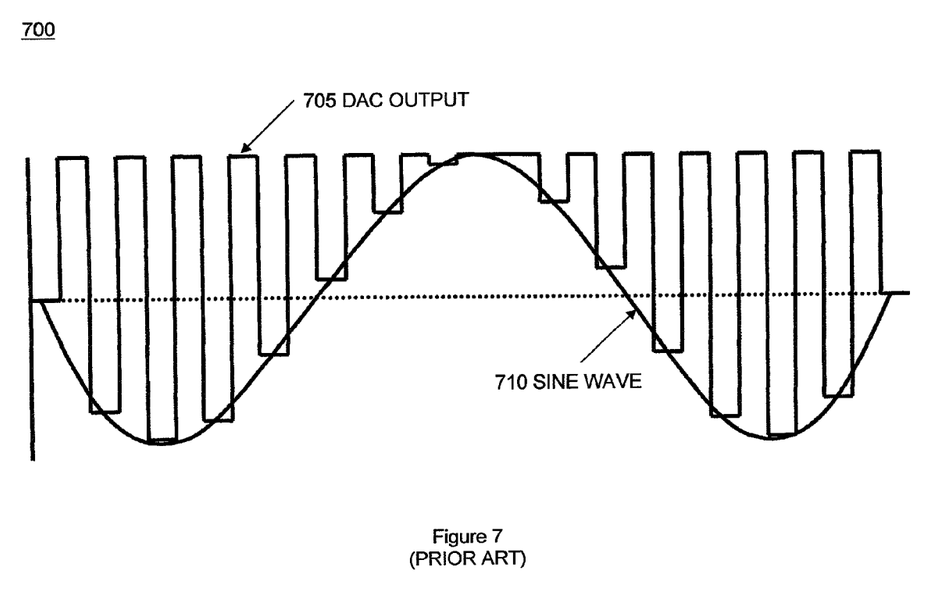
FIG. 7 displays a graph of a prior art single-ended RTZ DAC output.

FIG. 7 displays a graph 700 of a typical prior art single-ended RTZ DAC output 705 of a sine-wave 710 for the switch of FIG. 6. While the typical RTZ differentially returns to zero, single-endedly it returns to a rail. This approach has a long slew rate when returning to zero from an output at the bottom rail. A true return to zero would return to the midpoint of the DAC output range.

What is needed is a method and apparatus for enhanced DAC performance through improved spurious free dynamic range (SFDR) and accurate return to zero (RTZ) performance.

SUMMARY OF THE INVENTION

A digital to analog converter (DAC) method and apparatus employs a multiplying-adding DAC, eliminating digital adder circuitry. Examples are given for multiplying a 3-bit binary number by a 2-bit binary number; however, there are no limitations to the bit-widths of the numbers to be multiplied. The multiplying-adding DAC method can be scaled up or down in bit-width by feeding the DAC with partial sums and adjusting the DAC weights accordingly. An analog to digital converter (ADC) can be placed after the DAC to generate a digital output. By multiplexing preset digital data into the DAC core for return to zero (RTZ), a true zero that is the midpoint of the DAC output range is achieved. It does not return to a rail for single-ended outputs. RTZ in DAC circuits doubles the null frequency of sin(x)/x roll-off inherent in DACs and also helps reduce switching glitches in the DAC output.

Multiplying-Adding

The multiplying-adding DAC eliminates digital adder circuitry, reducing power consumption and enabling high-speed operation. Computing the summing portion of the multiplication operation in the analog domain eliminates the need for the adder circuitry, leading to reduced power consumption. The DAC is already used in DDS applications. Modifications to the DAC allow it to compute the multiplication. The multiplying-adding DAC is not limited to DDS circuits. It can be used as-is in more general circuits where an analog output is desired, and it could be followed by an analog to digital converter (ADC) in circuits where a digital output is desired.

RTZ

A circuit and method of implementing a high-speed RTZ DAC using NPN transistors, including SiGe technology, is disclosed. By multiplexing preset digital data into the DAC core, a true zero that is the midpoint of the DAC output range can be achieved instead of a zero that is a rail as in prior art.

Embodiments provide true RTZ (midpoint of DAC output range) for both differential and single-ended outputs. They can support arbitrary return location for single-ended outputs. They also provide improved slew rate, since the return is to the midpoint of the DAC output range instead of a rail.

Embodiments provide: use as a return to an arbitrary level for single ended outputs; DAC switches require one less level of input, so lower supply voltage/power is required; RTZ compensation switch steers ½*I through both legs, or 1*I through a single leg. The technique is transferable to other types of devices/technologies in addition to NPN transistors and SiGe. RTZ also helps to reduce switching glitches in the DAC output.

Embodiments include a digital to analog converter (DAC) device comprising analog domain computation of summing of multiplication operation, wherein digital adder circuitry is excluded, and whereby spurious free dynamic range (SFDR) is improved and power consumption is reduced. Other embodiments comprise a multiplying-adding DAC (MAcDAC). In further embodiments the DAC operates in a direct digital synthesizer (DDS) circuit and the MAcDAC is scaled by providing partial sums. For some embodiments, the MAcDAC is scaled by adjusting DAC weights. Other embodiments comprise weights of 1, 2, 2, 4, 4, and 8. Yet other embodiments comprise a 30 GHz clock in, and in others, operation of the MAcDAC comprises multiplying a 3-bit binary number by a 2-bit binary number. Additional embodiments comprise a separate clock input.

Embodiments provide a digital to analog converter (DAC) method comprising a return to zero (RTZ) method comprising multiplexing preset digital data into a DAC core whereby a true zero midpoint is achieved for output range of the DAC and wherein switching glitches are reduced. Other embodiments comprise selecting steering one-half of a current through both legs of a circuit or a full current through a single leg of a circuit. In still other embodiments, the preset data is sent to RTZ at midpoint of DAC output range whereby slew rate is improved. In some embodiments output is single-ended, and in some output is differential. For other embodiments, the method comprises arbitrary return location for single-ended outputs and in some, preset data compensates for a difference between a $2^N$ weight of DAC most significant bit (MSB) and a $2^N-1$ weight of DAC least significant bits (LSBs) by acting as a weight of 0 in normal operation and a weight of 1 in RTZ operation. In yet further embodiments, the method comprises eleven data bits and two RTZ compensation bits. Additional embodiments comprise true RTZ weights of 4-16*I thermocoded weights for high; 3-16*I thermocoded weights for low; 8*I, 4*I, 2*I, 1*I binary weights for low; and 2½*I RTZ compensation weights for both low, wherein output level is 64*I.

Yet another embodiment is a digital to analog converter (DAC) comprising analog domain computation of summing of multiplication operation, wherein digital adder circuitry is excluded, and whereby spurious free dynamic range (SFDR) is improved and power consumption is reduced; and return to zero (RTZ) circuits whereby multiplexed preset digital data achieves a true zero midpoint for output range of the DAC, and wherein the RTZ comprises NPN transistors in SiGe technology.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Multiplying-Adding DAC

The multiplying-adding DAC eliminates digital adder circuitry. Less complex logic is used, circuitry is faster and power consumption is lower from reduced gate count. The non-binary DAC reduces skew by eliminating the weight of 16. Overall current is reduced by 10 weights, since the 16 weight is removed and extra 2 and 4 weights are added. Examples are given for multiplying a 3-bit binary number by a 2-bit binary number; however, there are no limitations to the bit-widths of the numbers to be multiplied. The multiplying-adding DAC method can be scaled up or down in bit-width by feeding the DAC with partial sums and adjusting the DAC weights accordingly. An analog to digital converter (ADC) can be placed after the DAC to generate a digital output. The approach is not limited to DDS circuits; it can be used in any circuit where a digital or analog multiplication output is desired. The following figures include embodiments demonstrating the multiplying-adding DAC implemented within a high-speed DDS for improved SFDR.

Figure 2:
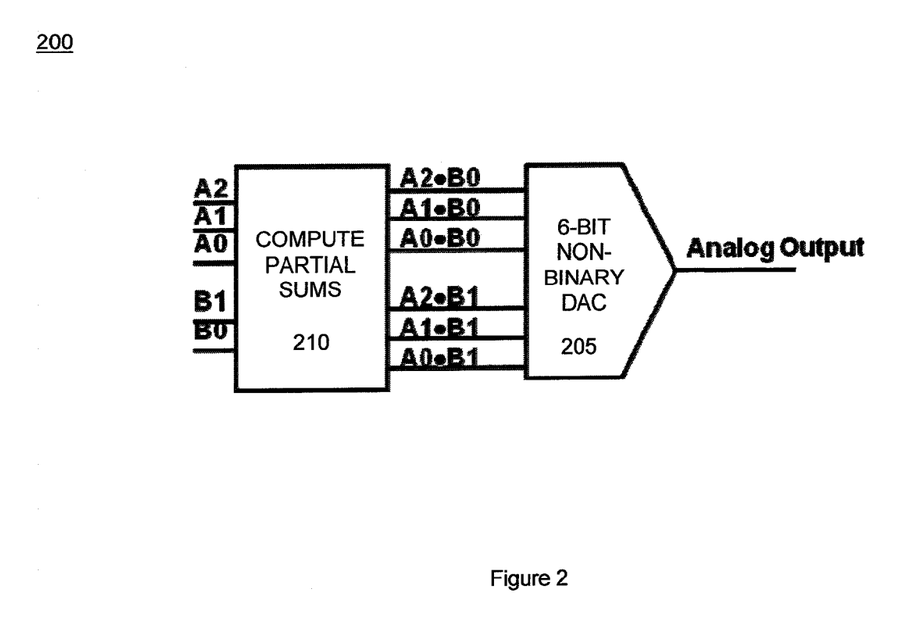
FIG. 2 is a block diagram of a multiplying-adding DAC (MAcDAC) configured in accordance with an embodiment.

FIG. 2 is a block diagram 200 of a multiplying-adding DAC (MAcDAC). Multiplication is simplified by leveraging an analog output. Instead of performing a digital addition of the partial sums, a non-binary DAC 205 performs an analog addition of the partial sums input from 210. This approach eliminates adder circuitry and only adds one bit to the DAC.

Figure 3:
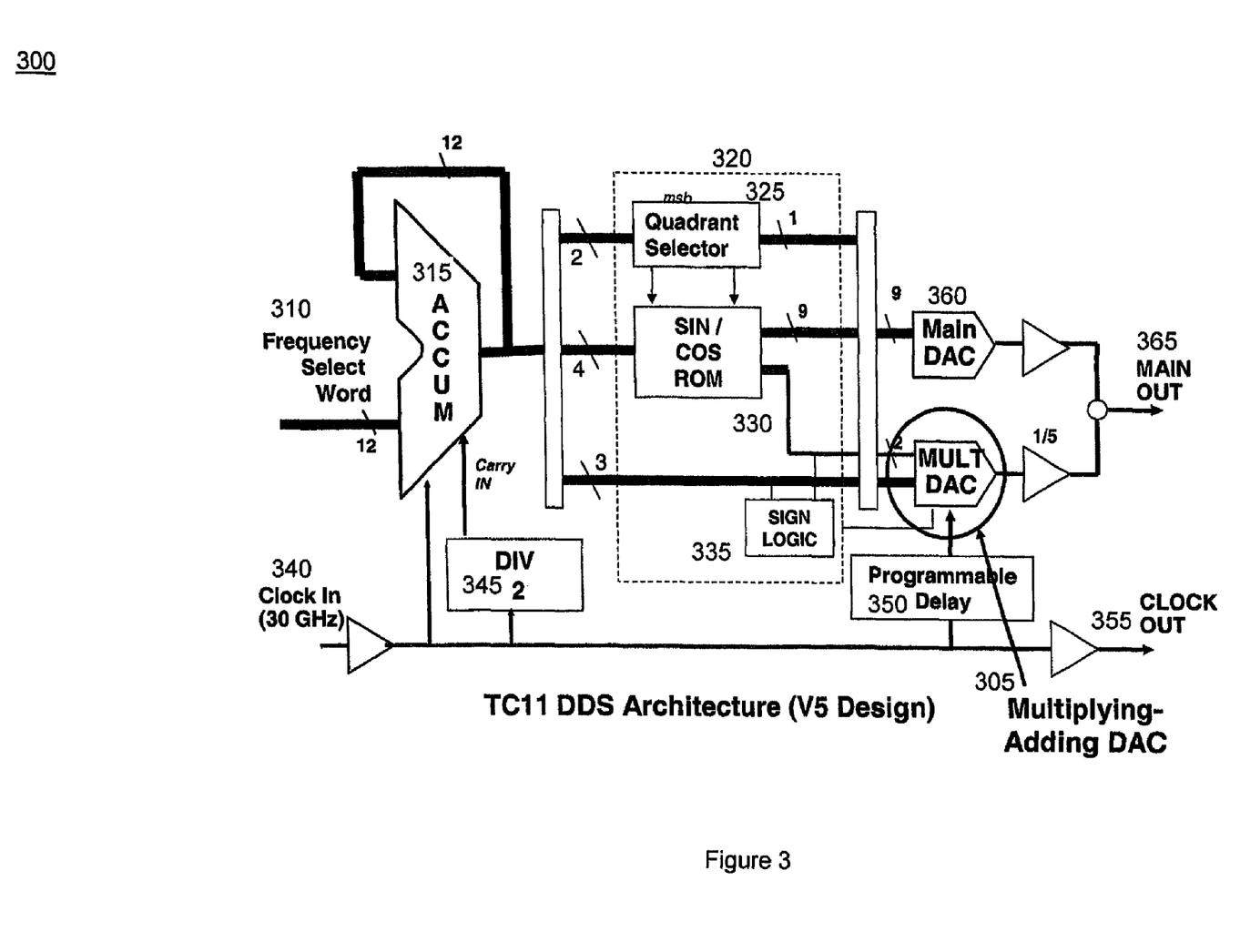
FIG. 3 is a block diagram of a multiplying-adding DAC (MAcDAC) implemented in a high-speed DDS circuit configured in accordance with an embodiment.

FIG. 3 is a block diagram 300 of a multiplying-adding DAC (MAcDAC) 305 implemented in a high-speed DDS circuit. Frequency select word 310 is input to accumulator 315 providing input to thermo-code ROM components 320 including quadrant selector 325, sin/cos ROM 330, and sign logic 335. Clock in 340 provides input to accumulator 315, divide by two 345, programmable delay 350, and clock out 355. Divide by two 345 provides carry in input to accumulator 315. ROM components 320 and programmable delay 350 provide input to MAcDAC 305. ROM components 320 also provide input to main DAC 360. Main DAC 360 and MAcDAC 305 produce main out 365. In embodiments, clock-in 340 is 30 GHz. Note that divide by two 345 is not included in some embodiments.

Figure 4:
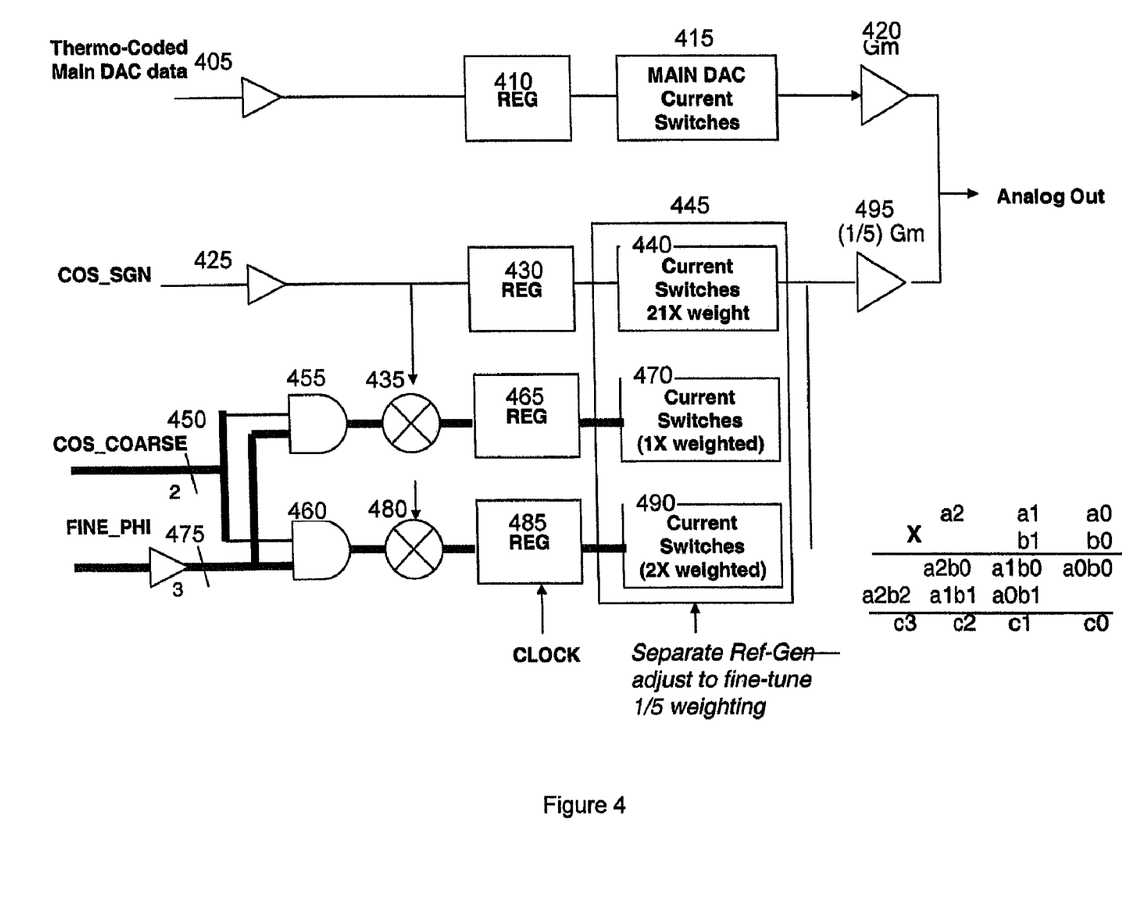
FIG. 4 is a block diagram of a multiplying-adding DAC (MAcDAC) configured in accordance with an embodiment.

FIG. 4 is a block diagram 400 of a MAcDAC. Except for components 405, 410, 415, 420, and 495, it represents MAcDAC 305 of FIG. 3. The non-binary DAC has weights of 1, 2, 2, 4, 4, and 8, denoted by DAC1, DAC2a, DAC2b, DAC4a, DAC4b, and DAC8. The resulting logic equations driving the DAC are:

$$DAC1 = A0 \cdot B0$$

$$DAC2a = A1 \cdot B0$$

$$DAC4a = A2 \cdot B0$$

$$DAC2b = A0 \cdot B1$$

$$DAC4b = A1 \cdot B1$$

$$DAC8 = A2 \cdot B1$$

|  | A2 | A1 | A0 |
|---|---|---|---|
| × |  | B1 | B0 |
| S1 = |  $A2 \cdot B0$ | $A1 \cdot B0$ | $A0 \cdot B0$ |
| S2 = $A2 \cdot B1$ | $A1 \cdot B1$ | $A0 \cdot B1$ |  |
| Weight of 8 | Weight of 4 | Weight of 2 | Weight of 1 |

S1 corresponds to DAC1, DAC2a, and DAC4a. S2 corresponds to DAC2b, DAC4b, and DAC8. In block diagram 400, Thermo-coded main DAC data 405 is input to register 410. Register 410 output is applied to main DAC current switches 415 whose output is applied to Gm gain block 420. Cos_sin input 425 is provided to register 430 and adder 435. Register 430 output is applied to 21× weight current switches (DAC1, DAC2a, DAC4a, DAC2b, DAC4b, DAC8) 440 within current switches 445. Cos_coarse 450 provides input to two parallel AND gates 455 and three parallel AND gates 460. The 2 parallel AND gates 455 provide input to adder 435. Adder 435 provides input to register 465 whose output is applied to 1× weight current switches 470. Fine_phi input 475 is applied to three parallel AND gates 460. The 3 parallel AND gates 460 provide input to adder 480 which provides input to register 485. Register 485 output is applied to 2× weight current switches 490. Current switches 445 output is applied to the (⅛)Gm gain block 495 whose output, combined with Gm gain block 420 output, provides the analog output.

Figure 5:
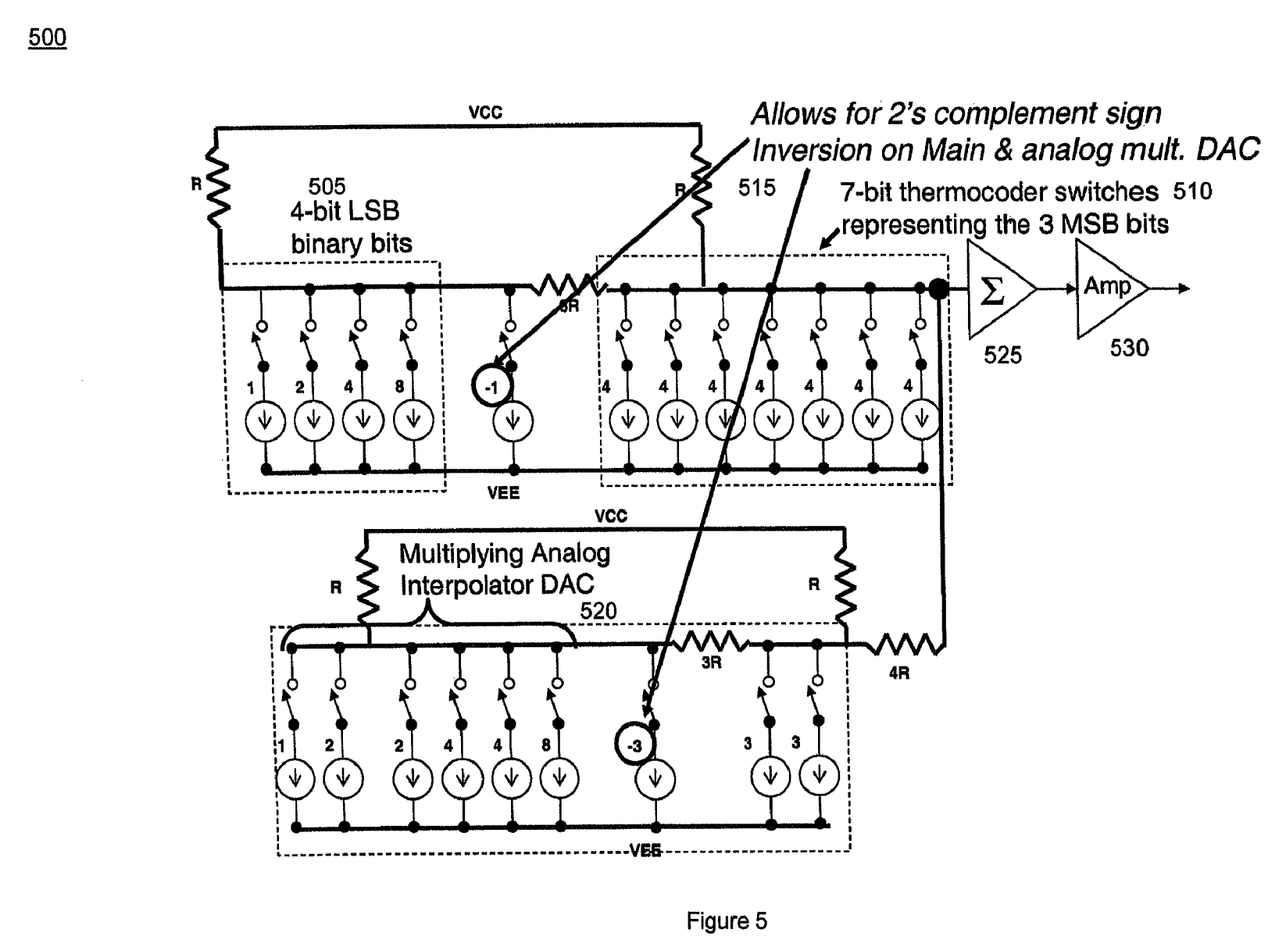
FIG. 5 is a block diagram of a 7-bit DAC with multiplying analog interpolator configured in accordance with an embodiment.

FIG. 5 is a block diagram 500 of a 7-bit DAC with a multiplying analog interpolator and R-3R resistor scaling. Least significant bit (LSB) section 505 provides the four LSB binary bits. Most significant bit (MSB) section 510 provides 7-bit thermocoder switches representing the three MSB bits. Components 515 allow for two's compliment sign inversion on the main and analog multiplying DACs. Multiplying analog interpolator DAC section 520 is combined at summation 525 and amplified at 530 for output.

RTZ DAC

FIGS. 6 and 7 discussed prior art in the background section.

Figure 8:
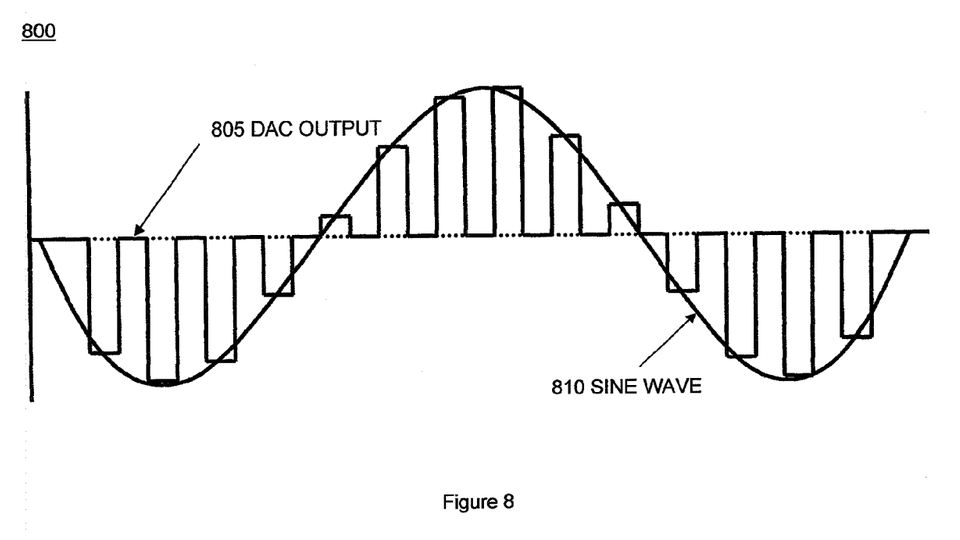
FIG. 8 displays a graph of the output of a singled-ended true RTZ DAC output configured in accordance with an embodiment.

FIG. 8 displays a graph 800 of the output of an embodiment of a singled-ended true RTZ DAC output 805 of a sine-wave 810. Instead of switching the current away from the summing junction with the DAC current switch for an RTZ, preset data is sent to RTZ at the midpoint of the DAC output range. This approach has an improved slew rate since the worst case slew will be half as bad as the prior approach (rail to middle instead of rail to rail). Either the single-ended or differential output of the DAC can be used, since both return to a true zero of the waveform.

Figure 9:
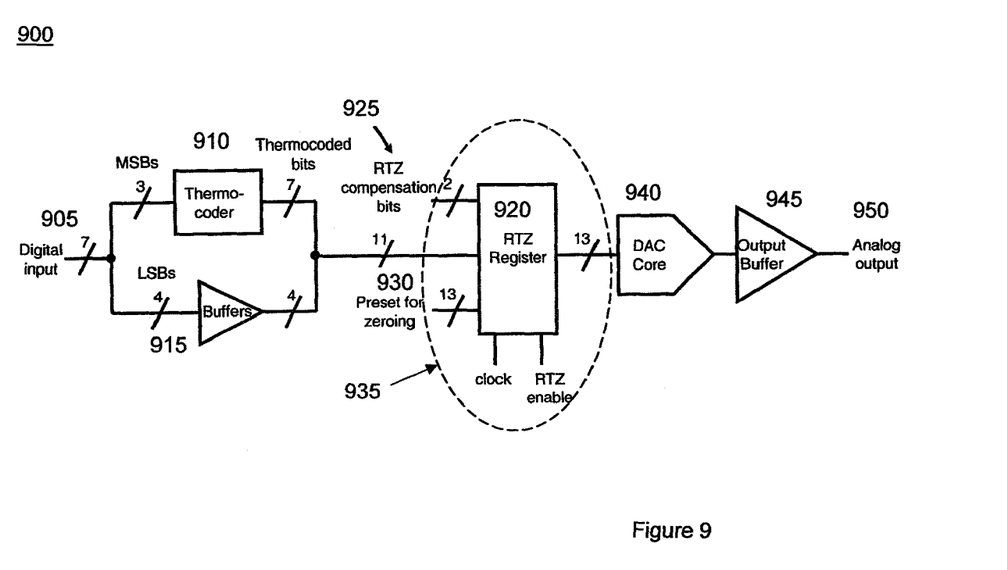
FIG. 9 is an RTZ DAC block diagram configured in accordance with an embodiment.
Figure 10:
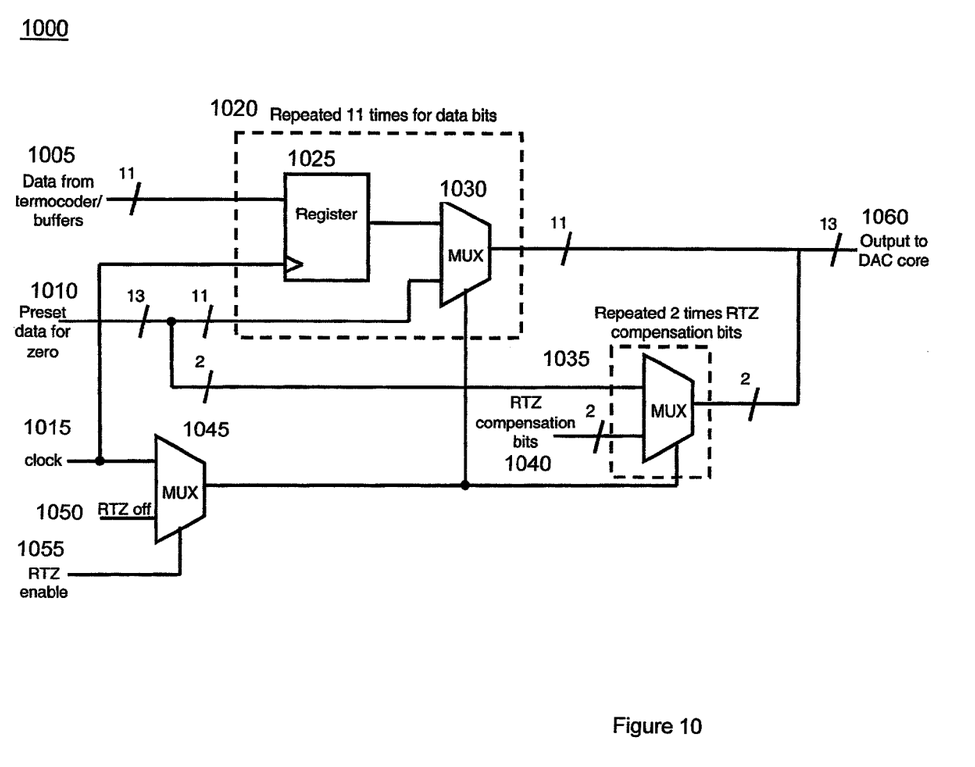
FIG. 10 is an RTZ register block diagram configured in accordance with an embodiment.

FIG. 9 is an RTZ DAC block diagram 900. Digital input 905 is applied to input of thermocoder 910 and buffers 915. These provide input to RTZ register 920. RTZ compensation bits are added 925 for a true zero. If RTZ is enabled, data to the DAC core is switched between registered input and data that is preset for zeroing 930. Output of RTZ registers 935 provides input to DAC core 940. DAC core 940 provides input for Output buffer 945 which outputs Analog output 950. FIG. 10 presents more detail of RTZ registers 935.

FIG. 10 is an RTZ register block diagram 1000. Data from thermocoder/buffers 1005, preset data for zero 1010, and clock 1015 are input to register sections 1020 which are repeated 11 times for data bits. Register sections 1020 each contains register 1025 and MUX 1030. RTZ compensation MUX 1035 which is repeated two times for RTZ compensation bits 1040 input and preset data for zero 1010 input compensates for the difference between the $2^N$ weight of the DAC MSB and the $2^N-1$ weight of the DAC LSBs by acting as a weight of 0 in normal operation and a weight of 1 in RTZ operation. Another MUX 1045 receives input from clock 1015, RTZ off 1050, and RTZ enable 1055. Output of MUX 1030 and MUX 1035 provide output to DAC core 1060.

Figure 11:
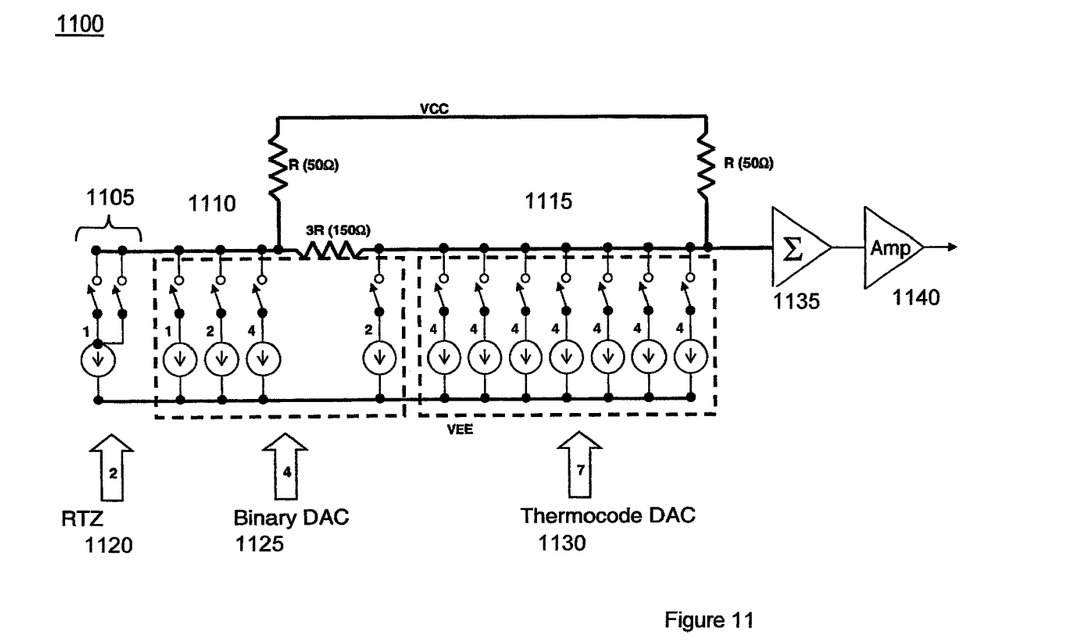
FIG. 11 is a MUX DAC chip DAC structure configured in accordance with an embodiment.

FIG. 11 is the DAC current switch structure 1100 of the RTZ DAC. DAC structure comprises RTZ compensation switch section 1105, binary DAC section 1110, and thermocode DAC section 1115. RTZ compensation switch section 1105 receives RTZ compensation switch driver input 1120 allowing for true RTZ. Binary DAC section 1110 receives binary DAC switch drivers input 1125. Thermocode DAC section 1115 receives thermocode switch drivers input 1130. DAC output is applied to input of summation 1135 which provides input to amplifier 1140. In RTZ state, 4 thermo-coded switches are driven by logic high, and the remaining switches are driven by logic low. In a normal state, the RTZ compensation switches are in opposite states.

Figure 12:
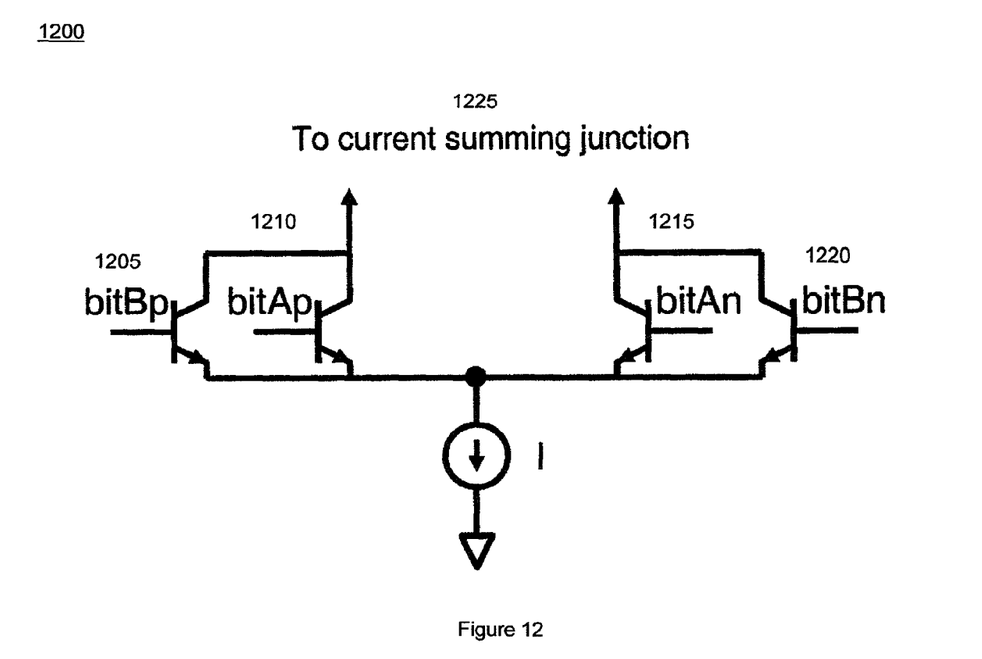
FIG. 12 is a diagram of DAC switch drivers configured in accordance with an embodiment.

FIG. 12 is a diagram of DAC switch driver 1200. This can be employed as RTZ compensation switch 1105 of FIG. 11. RTZ compensation switch driver comprises bitBp 1205, bitAp 1210, bitAn 1215, and bitBn 1220, each providing input to current summing junction 1225. There is one less level than in the typical approach, so a lower supply voltage and lower power are achieved with this RTZ embodiment. For RTZ compensation switch driver, ½*1 is steered through each leg when bitA and bitB are in opposite states, and 1*1 is steered through one leg when both are in the same state.

RTZ circuit operation distinctions between normal return to zero (NRZ) and 'true' RTZ embodiments follow. NRZ operation is characterized by: 1.) 7-16*I thermocoded weights (controlled by input data); 2.) 8*I, 4*I, 2*I, and 1*I binary weights (controlled by input data); 3.) 2½*I RTZ compensation weights (one high, one low); 4.) DAC output range of 0.5*I to 127.5*I; and 5.) DAC midpoint of 64*I. 'True' RTZ operation is characterized by: 1.) 4-16*I thermocoded weights (high); 2.) 3-16*I thermocoded weights (low); 3.) 8*I, 4*I, 2*I, 1*I binary weights (low); 4.) 2½*I RTZ compensation weights (both low); and 5.) Output level: 64*I (DAC midpoint for true RTZ).

Figure 13:
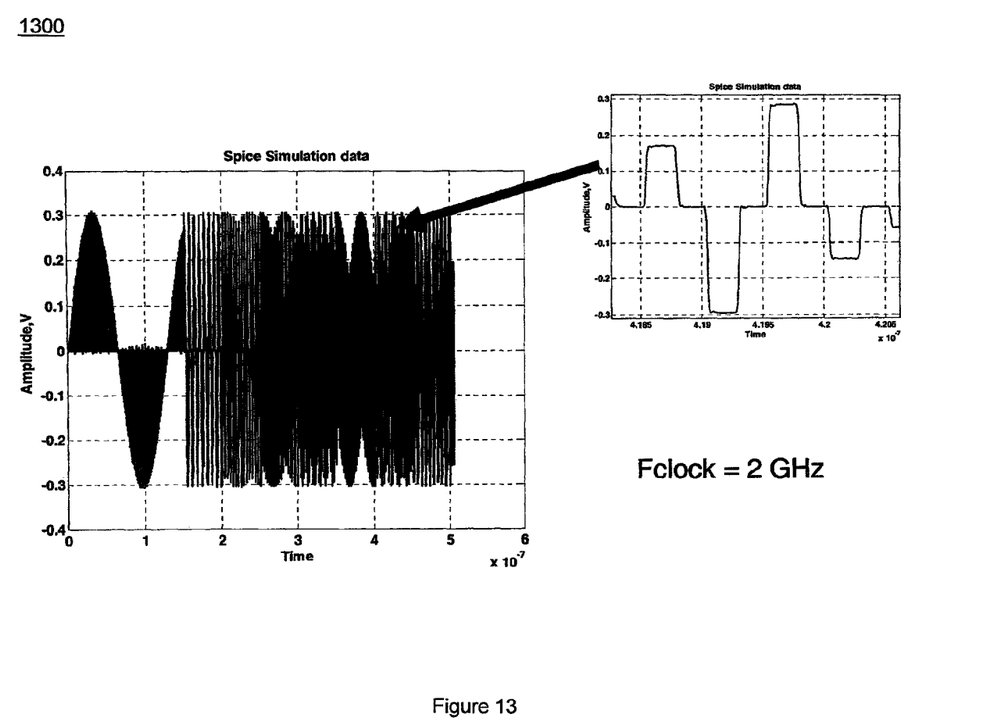
FIG. 13 depicts RTZ DAC simulation results configured in accordance with an embodiment.

FIG. 13 depicts RTZ DAC Simulation Program with Integrated Circuit Emphasis (using SPICE) circuit simulation results 1300. Results depict pre-extracted, DAC core output only. Extracted results indicate operation at Fclock greater than 2 GHz.

Figure 14:
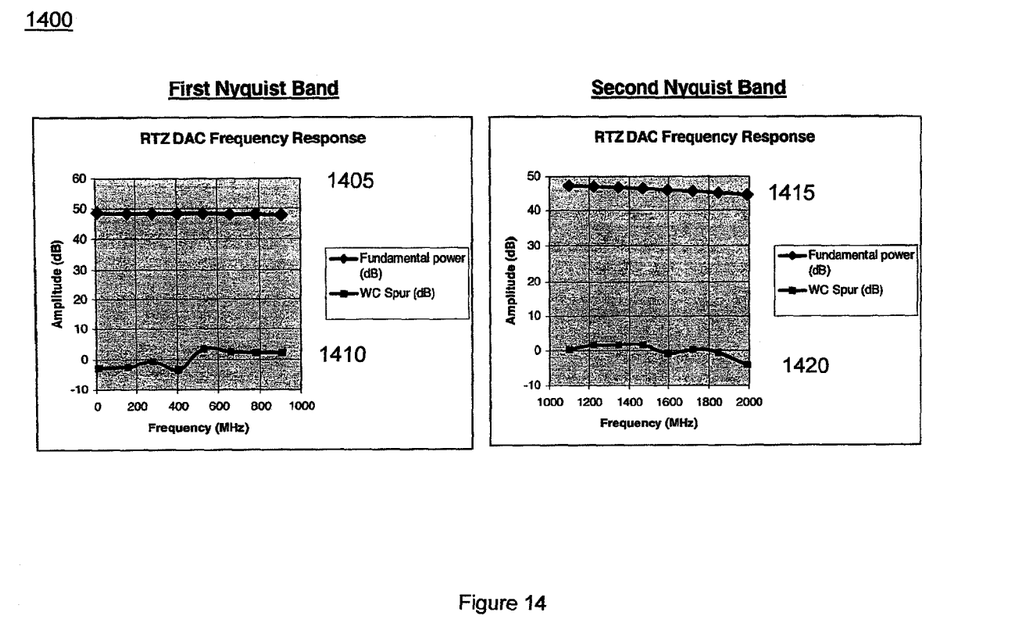
FIG. 14 depicts RTZ DAC simulation results, DAC core only output configured in accordance with an embodiment.

FIG. 14 depicts RTZ DAC SPICE simulation frequency response results 1400 for pre-extracted, DAC core only output. First Nyquist band fundamental power 1405 and first Nyquist band WC Spur 1410 are depicted in dB for 0 to 1,000 MHz. Second Nyquist band fundamental power 1415 and second Nyquist band WC Spur 1420 are depicted in dB for 1,000 MHz to 2,000 MHz. First Nyquist band exhibits 1 dB amplitude rolloff and 45 dB worst-case SFDR. Second Nyquist band exhibits 3 dB amplitude rolloff; 45 dB worst-case SFDR.

Figure 15:
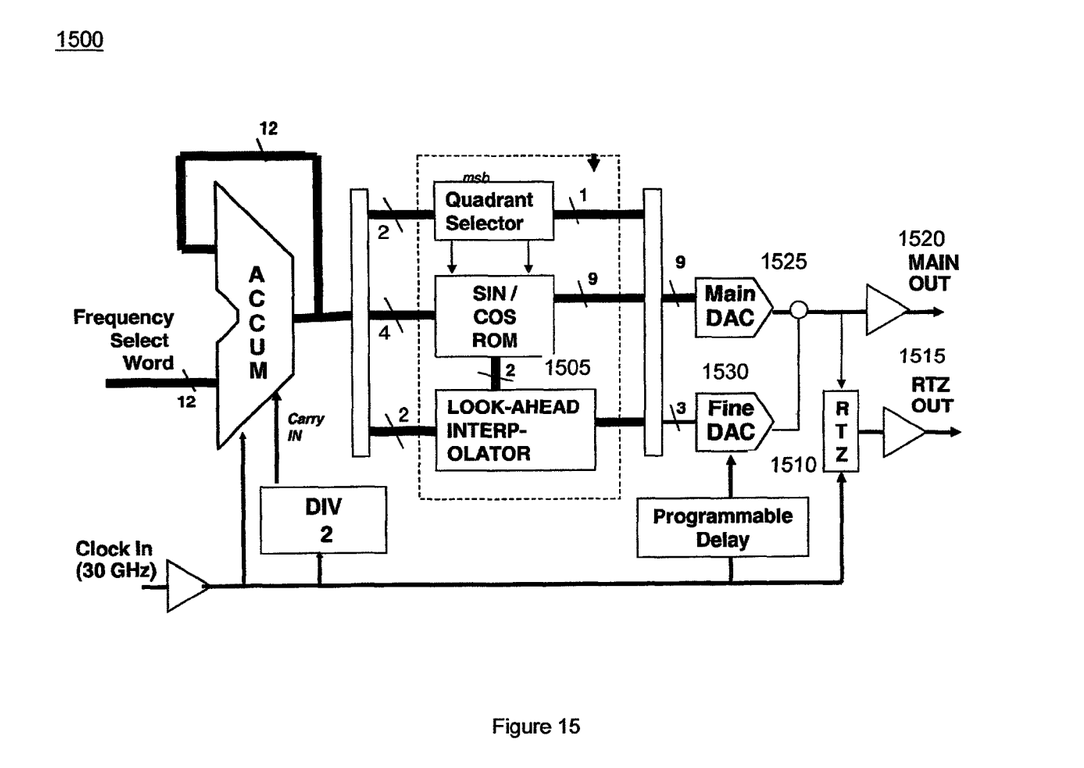
FIG. 15 is a block diagram of a MAcDAC implemented in a high-speed DDS circuit with a look-ahead interpolator and RTZ configured in accordance with an embodiment.

FIG. 15 is a block diagram 1500 of a MAcDAC implemented in a high-speed DDS circuit with a look-ahead interpolator 1505 and RTZ component 1510. This provides RTZ out 1515 in addition to main out 1520 which receives output from Main DAC 1525 and Fine DAC 1530. This architecture supports 0.25 micron baseline ROM design with thermo-code embedded in ROM. The original DAC core has thermo-coder removed with improved clock and bias distribution. Improved output buffers accompany 4 micron devices, separate $V_{cco}$, and separate bias adjustment. Embodiments include 30 GHz clock-in.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A digital to analog converter (DAC) device comprising:
inputs to receive partial sums from a digital multiplier;
an analog domain summer to compute the summation of the partial sums, wherein digital adder circuitry is excluded with a reduction in power consumption; and
wherein preset data compensates for a difference between a 2N weight of DAC most significant bit (MSB) and a 2N−1 weight of DAC least significant bits (LSBs) by acting as a weight of 0 in normal operation and a weight of 1 in RTZ operation.

2. The device of claim 1, comprising a multiplying-adding DAC (MAcDAC).

3. The device of claim 1, wherein said DAC operates in a direct digital synthesizer (DDS) circuit.

4. The device of claim 2, wherein said MAcDAC is scaled by providing partial sums.

5. The device of claim 2, wherein said MAcDAC is scaled by adjusting DAC weights.

6. The device of claim 1, comprising weights of 1, 2, 2, 4, 4, and 8.

7. The device of claim 1, comprising a 30 GHz clock in.

8. The device of claim 2, wherein operation of said MAcDAC comprises multiplying a 3-bit binary number by a 2-bit binary number.

9. The device of claim 2, comprising a separate clock input.

10. A digital to analog converter (DAC) method comprising a return to zero (RTZ) method comprising:
alternating inputs to a DAC core wherein the inputs are alternated between a digital data stream and a preset digital data word, and wherein the preset digital data word is chosen to achieve a true zero midpoint for output range of said DAC, and wherein switching glitches are reduced; and
wherein preset data compensates for a difference between a 2N weight of DAC most significant bit (MSB) and a 2N−1 weight of DAC least significant bits (LSBs) by acting as a weight of 0 in normal operation and a weight of 1 in RTZ operation.

11. The method of claim 10 comprising:
selecting steering one-half of a current through both legs of a circuit or a full current through a single leg of a circuit.

12. The method of claim of claim 10 wherein said preset data is sent to RTZ at midpoint of DAC output range whereby slew rate is improved.

13. The method of claim 10 wherein output is single-ended.

14. The method of claim 10 wherein output is differential.

15. The method of claim 10 comprising arbitrary return location for single-ended outputs.

16. The method of claim 10 wherein said method comprises eleven data bits.

17. The method of claim 10 wherein said method comprises two RTZ compensation bits.

18. The method of claim 10 comprising true RTZ weights of:
4-16*I thermocoded weights for high;
3-16*I thermocoded weights for low;
8*I, 4*I, 2*I, 1*I binary weights for low; and
2½*I RTZ compensation weights for both low, wherein output level is 64*I.

19. A digital to analog converter (DAC) comprising:
inputs to receive partial sums from a digital multiplier;
an analog domain summer to compute the summation of the partial sums, wherein digital adder circuitry is excluded with a reduction in power consumption;
return to zero (RTZ) circuits whereby multiplexed preset digital data achieves a true zero midpoint for output range of said DAC, and wherein said RTZ comprises NPN transistors in SiGe technology; and
wherein said preset data compensates for a difference between a 2N weight of DAC most significant bit (MSB) and a 2N−1 weight of DAC least significant bits (LSBs) by acting as a weight of 0 in normal operation and a weight of 1 in RTZ operation.

20. The device of claim 1 comprising true RTZ weights of:
4-16*I thermocoded weights for high;
3-16*I thermocoded weights for low;
8*I, 4*I, 2*I, 1*I binary weights for low; and
2-1/2*I RTZ compensation weights for both low, wherein output level is 64*I.

* * * * *